(12) United States Patent
Chuang et al.

(10) Patent No.: US 10,236,227 B2
(45) Date of Patent: Mar. 19, 2019

(54) ELECTRONIC PACKAGE AND FABRICATION METHOD THEREOF

(71) Applicant: Siliconware Precision Industries Co., Ltd., Taichung (TW)

(72) Inventors: Lung-Shan Chuang, Taichung (TW); Ching-Wen Chiang, Taichung (TW); Tzung-Yen Wu, Taichung (TW); Chun-Hung Lu, Taichung (TW)

(73) Assignee: Siliconware Prescision Industries Co., Ltd., Taichung (TW)

( * ) Notice: Subject to any disclaimer, the term of this patent is extended or adjusted under 35 U.S.C. 154(b) by 0 days.

(21) Appl. No.: 14/998,324

(22) Filed: Dec. 24, 2015

(65) Prior Publication Data
US 2016/0260644 A1    Sep. 8, 2016

(30) Foreign Application Priority Data

Mar. 6, 2015 (TW) .............................. 104107154 A

(51) Int. Cl.
*H01L 21/00* (2006.01)
*H01L 23/053* (2006.01)
(Continued)

(52) U.S. Cl.
CPC ........ *H01L 23/053* (2013.01); *H01L 21/6835* (2013.01); *H01L 21/78* (2013.01); *H01L 23/49822* (2013.01); *H01L 23/49827* (2013.01); *H01L 24/97* (2013.01); *H01L 21/4803* (2013.01); *H01L 21/486* (2013.01); *H01L 23/147* (2013.01); *H01L 23/49811* (2013.01); *H01L 2224/16227* (2013.01); *H01L 2224/16235* (2013.01); *H01L 2224/32225* (2013.01); *H01L 2224/73204* (2013.01); *H01L 2224/73253* (2013.01); *H01L 2224/81005* (2013.01); *H01L 2224/83005* (2013.01); *H01L 2224/97* (2013.01); *H01L 2924/15311* (2013.01); *H01L 2924/167* (2013.01); *H01L 2924/16152* (2013.01); *H01L 2924/16153* (2013.01); *H01L 2924/16251* (2013.01)

(58) Field of Classification Search
CPC . H01L 2223/54486; H01L 2924/16152; H01L 2924/1815; H01L 24/96; H01L 29/0655
USPC ........ 257/704, 723, 724; 438/107, 108, 110, 438/113, 462
See application file for complete search history.

(56) References Cited

U.S. PATENT DOCUMENTS 4,907,065 A * 3/1990 Sahakian ................ H01L 23/04
257/684
6,621,161 B2 * 9/2003 Miyawaki ............... H01L 21/50
257/620
(Continued)

*Primary Examiner* — Sheila V Clark
(74) *Attorney, Agent, or Firm* — Mintz Levin Cohn Ferris Glovsky and Popeo, P.C.; Peter F. Corless; Steven M. Jensen

(57) ABSTRACT

An electronic package is provided, including a circuit portion, an electronic element disposed on the circuit portion and a lid member disposed on the circuit portion to cover the electronic element. A separation portion is formed between the lid member and the electronic element. The lid member facilitates to prevent warping of the overall package structure. The invention further provides a method for fabricating the electronic package.

7 Claims, 5 Drawing Sheets

(51) Int. Cl.
*H01L 21/683* (2006.01)
*H01L 21/78* (2006.01)
*H01L 23/00* (2006.01)
*H01L 23/498* (2006.01)
*H01L 21/48* (2006.01)
*H01L 23/14* (2006.01)

(56) References Cited

U.S. PATENT DOCUMENTS

| | | | | |
|---|---|---|---|---|
| 6,720,647 B2* | 4/2004 | Fukuizumi | H01L 23/3672 | 257/698 |
| 7,378,748 B2* | 5/2008 | Shimizu | H01L 27/14618 | 257/678 |
| 7,576,427 B2* | 8/2009 | Potter | B81C 1/00269 | 257/704 |
| 7,719,110 B2* | 5/2010 | Zhao | H01L 23/055 | 257/704 |
| 8,063,482 B2* | 11/2011 | Lu | H01L 23/04 | 257/678 |
| 8,084,297 B1* | 12/2011 | Joshi | H01L 23/04 | 438/106 |
| 8,324,728 B2* | 12/2012 | Tabrizi | H01L 23/055 | 257/704 |
| 8,803,314 B2* | 8/2014 | Chahal | B81B 7/007 | 257/684 |
| 9,041,182 B2* | 5/2015 | Nagano | H01L 23/48 | 257/678 |
| 9,041,192 B2* | 5/2015 | Saeidi | H01L 23/16 | 257/675 |
| 2003/0042618 A1* | 3/2003 | Nose | H01L 22/32 | 257/778 |
| 2004/0108588 A1* | 6/2004 | Gilleo | H01L 23/10 | 257/704 |
| 2005/0006738 A1* | 1/2005 | Schaper | B81C 1/00301 | 257/678 |
| 2010/0181665 A1* | 7/2010 | Casey | H01L 23/04 | 257/723 |
| 2012/0248553 A1* | 10/2012 | Takano | B81C 1/0023 | 257/415 |
| 2014/0117527 A1* | 5/2014 | Zhang | H01L 23/04 | 257/704 |
| 2015/0187679 A1* | 7/2015 | Ho | H01L 21/4803 | 257/690 |
| 2015/0287672 A1* | 10/2015 | Yazdani | H01L 21/486 | 257/414 |
| 2015/0364392 A1* | 12/2015 | Takahashi | H01L 24/74 | 257/704 |

* cited by examiner

ELECTRONIC PACKAGE AND FABRICATION METHOD THEREOF

CROSS-REFERENCES TO RELATED APPLICATIONS

This application claims under 35 U.S.C. § 119(a) the benefit of Taiwanese Application No. 104107154, filed Mar. 6, 2015, the entire contents of which are incorporated herein by reference.

BACKGROUND OF THE INVENTION

1. Field of the Invention

The present invention relates to electronic packages and fabrication methods thereof, and more particularly, to an electronic package having wafer-level circuits and a fabrication method thereof.

2. Description of Related Art

Along with the rapid development of electronic industries, electronic products are developed toward the trend of multi-function and high performance. Current chip packaging technologies have developed various types of flip-chip packaging modules such as chip scale packages (CSPs), direct chip attached (DCA) packages and multi-chip module (MCM) packages.

FIGS. 1A to 1F are schematic cross-sectional views showing a method for fabricating a semiconductor package 1 according to the prior art.

Referring to FIG. 1A, a semiconductor structure is provided. The semiconductor structure has a silicon substrate 10, a circuit portion 11 formed on the silicon substrate 10, a plurality of semiconductor chips 12 flip-chip bonded to the circuit portion 10, and an underfill 13 formed between the circuit portion 11 and the semiconductor chips 12.

Referring to FIG. 1B, an encapsulant 14 is formed on the circuit portion 11 to encapsulate the semiconductor chips 12 and the underfill 13.

Referring to FIG. 1C, an upper portion of the encapsulant 14 is removed to expose the semiconductor chips 12.

Referring to FIG. 1D, a support member 15 is disposed on the encapsulant 14 and the semiconductor chips 12. The support member 15 has an adhesive layer 150, a silicon plate 151 and an insulating layer 152 sequentially stacked on one another. The insulating layer 152 is made of a dielectric material and formed through a chemical vapor deposition (CVD) process.

Referring to FIG. 1E, the silicon substrate 10 is removed to expose a lower surface of the circuit portion 11. Then, an insulating layer 17 is formed on the lower surface of the circuit portion 11. The circuit portion 11 is partially exposed from the insulating layer 17 for mounting solder balls 18.

Referring to FIG. 1F, a singulation process is performed along cutting paths S of FIG. 1E to obtain a plurality of semiconductor packages 1. The silicon plate 151 facilitates to enhance the rigidity of the semiconductor packages 1 and improve the heat dissipating effect of the semiconductor chips 12.

However, since a molding process is required to form the encapsulant 14 and a grinding process is required to remove the upper portion of the encapsulant 14, the overall fabrication process is quite complicated, labor and time consuming and needs various equipment, thereby incurring a high fabrication cost.

Further, a large CTE (Coefficient of Thermal Expansion) mismatch between the semiconductor chips 12 and the encapsulant 14 easily causes warping of the overall structure before singulation.

Furthermore, since the encapsulant 14 easily absorbs moisture, it can also result in warping of the overall structure before singulation.

As a result of warping, the semiconductor chips 12 easily crack and the solder balls 18 easily delaminate from the circuit portion 11, thus reducing the product reliability.

Therefore, how to overcome the above-described drawbacks has become critical.

SUMMARY OF THE INVENTION

In view of the above-described drawbacks, the present invention provides an electronic package, which comprises: a circuit portion having opposite first and second sides; at least an electronic element disposed on the first side of the circuit portion; and a lid member disposed on the first side of the circuit portion to cover the electronic element, wherein a separation portion is formed between the lid member and the electronic element.

The present invention further provides a method for fabricating an electronic package, which comprises the steps of: providing a semiconductor structure having a carrier, a circuit portion formed on the carrier and at least an electronic element disposed on the circuit portion, wherein the circuit portion has opposite first and second sides, the electronic element being disposed on the first side of the circuit portion and the second side of the circuit portion being bonded to the carrier; disposing a lid member on the first side of the circuit portion to cover the electronic element, wherein a separation portion is formed between the lid member and the electronic element; and removing the carrier.

After removing the carrier, the above-described method can further comprise performing a singulation process.

In the above-described package and method, an underfill can be formed between the first side of the circuit portion and the electronic element.

In the above-described package and method, the lid member can have at least a cavity for receiving the electronic element.

In the above-described package and method, the lid member can be in contact with the electronic element.

In the above-described package and method, the lid member can be made of a semiconductor material.

In the above-described package and method, the lid member can have a support portion disposed on the first side of the circuit portion and a base portion supported by the support portion over the first side of the circuit portion to cover the electronic element.

In the above-described package and method, a plurality of conductive elements can be formed on the second side of the circuit portion.

Therefore, the present invention replaces the conventional encapsulant with the lid member so as to simplify the fabrication process and save the equipment cost, thereby reducing the fabrication cost. Further, the lid member facilitates to prevent warping of the overall package structure.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "on", "a" etc. are merely for illustrative purposes and should not be construed to limit the scope of the present invention.

FIGS. 2A to 2D are schematic cross-sectional views showing a method for fabricating an electronic package 2 according to the present invention.

Figure 1A:
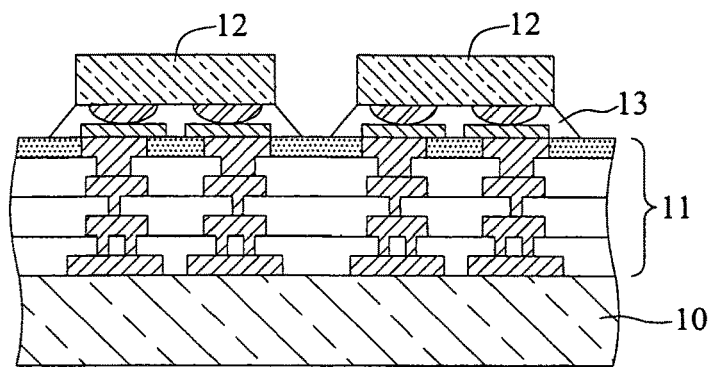
FIGS. 1A to 1F are schematic cross-sectional views showing a method for fabricating an electronic package according to the prior art.
Figure 1B:
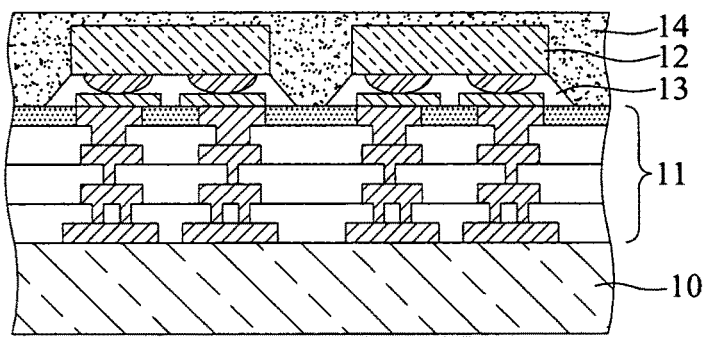
Figure 1C:
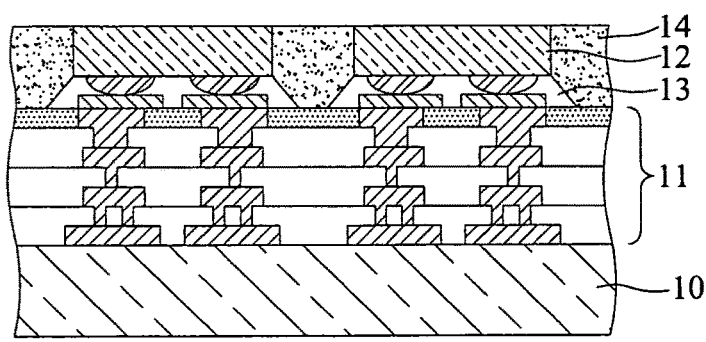
Figure 1D:
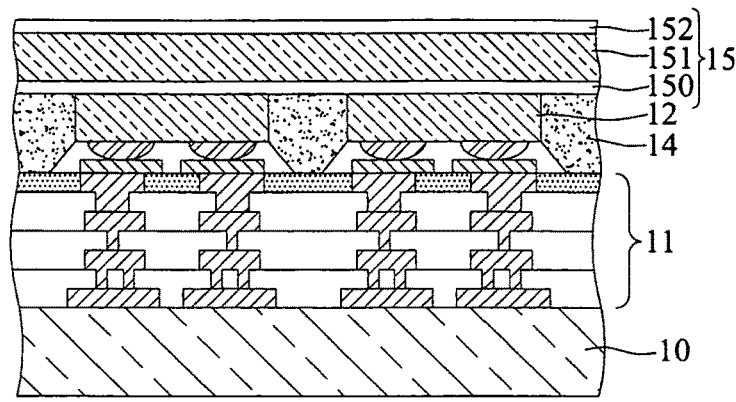
Figure 1E:
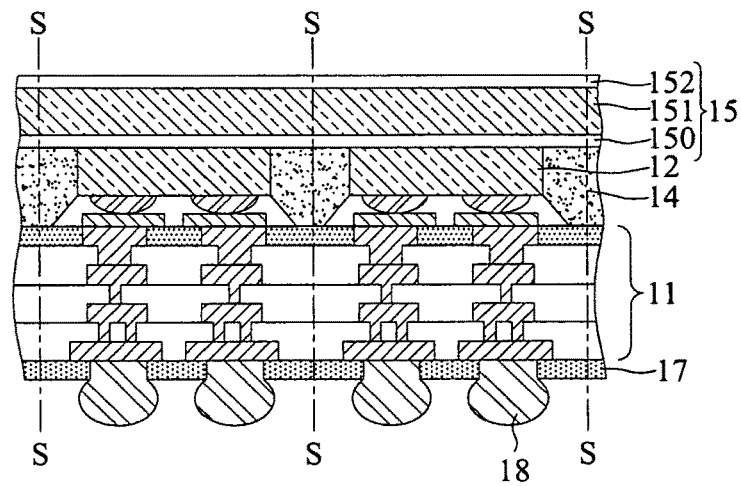
Figure 1F:
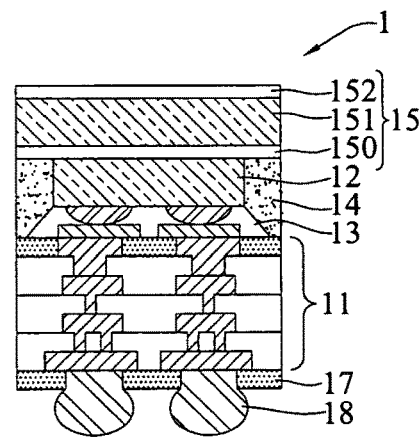
Figure 2A:
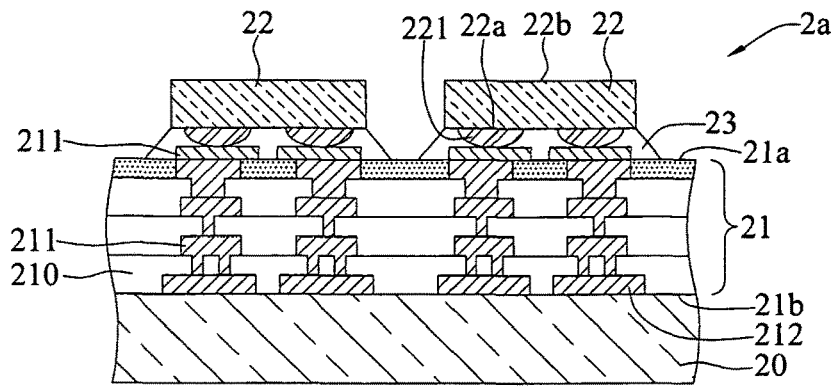
FIGS. 2A to 2D are schematic cross-sectional views showing a method for fabricating an electronic package according to the present invention, wherein FIGS. 2B' and 2B" show different embodiments of FIG. 2B, and FIGS. 2D' and 2D" show different embodiments of FIG. 2D.

Referring to FIG. 2A, a semiconductor structure 2a is provided. The semiconductor structure 2a has a carrier 20, a circuit portion 21 formed on the carrier 20, a plurality of electronic elements 22 disposed on the circuit portion 21, and an underfill 23 formed between the circuit portion 21 and the electronic elements 22.

In the present embodiment, the carrier 20 is made of a semiconductor material such as silicon.

Each of the electronic elements 22 is an active element such as a semiconductor chip, a passive element such as a resistor, a capacitor or an inductor, or a combination thereof. In the present embodiment, each of the electronic elements 22 is an active element having an active surface 22a and an inactive surface 22b opposite to the active surface 22a.

The circuit portion 21 has a plurality of dielectric layers 210 and a plurality of circuit layers 211 stacked alternately. The circuit portion 21 has a first side 21a and a second side 21b opposite to the first side 21a. The active surfaces 22a of the electronic elements 22 are bonded to the circuit layer 211 on the first side 21a of the circuit portion 21 through a plurality of conductive bumps 221, and the conductive bumps 221 are encapsulated by the underfill 23. The second side 21b of the circuit portion 21 is bonded to the carrier 20. Further, the second side 21b of the circuit portion 21 has a plurality of conductive pads 212.

The circuit layers 211 are wafer-level circuits instead of packaging substrate-level circuits. Currently, the packaging substrate-level circuits have a minimum line width/pitch of 12/12 um, but the wafer-level circuits have a minimum line width/pitch of 3/3 um.

Figure 2B:
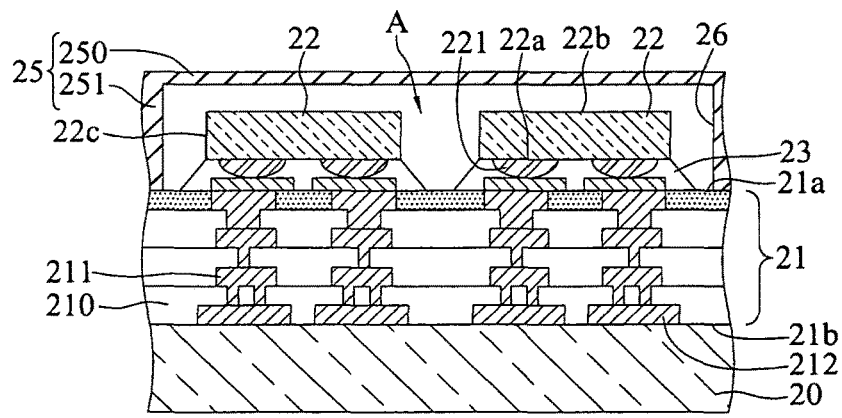
Figure 2B:
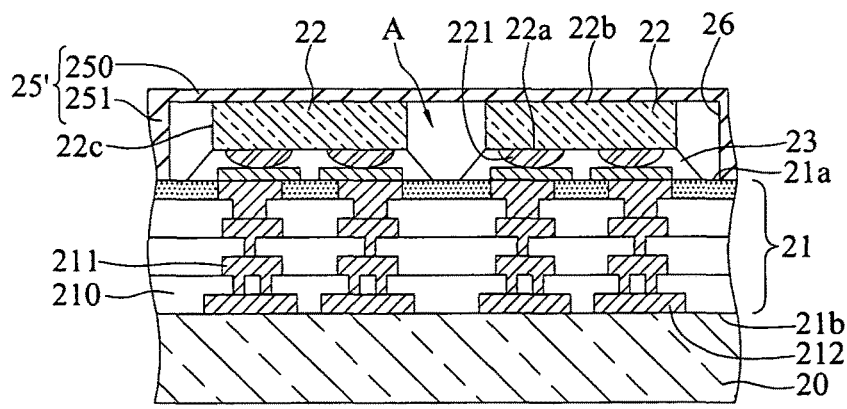

Referring to FIG. 2B, a lid member 25 is disposed on the first side 21a of the circuit portion 21 to cover the electronic elements 22 and the underfill 23. The lid member 25 has at least a cavity 26 for receiving the electronic elements 22 therein.

In the present embodiment, a separation portion A is formed between the lid member 25 and the electronic elements 22. In particular, the separation portion A is formed between the lid member 25 and the inactive and side surfaces 22b, 22c of the electronic elements 22. In another embodiment, referring to FIG. 2B', a base portion 250 of the lid member 25' is in contact with the inactive surfaces 22b of the electronic elements 22, and the separation portion A is only formed between the lid member 25' and the side surfaces 22c of the electronic elements 22.

The lid member 25 is made of a semiconductor material. For example, the lid member 25 is a silicon wafer. The lid member 25 has a support portion 251 disposed on the first side 21a of the circuit portion 21, and a base portion 250 supported by the support portion 251 over the first side 21a of the circuit portion 21 to cover the electronic elements 22 and the underfill 23. To fabricate the lid member 25, a silicon wafer can be etched to form the cavity 26 and the support portion 251, and the support portions 251 are side walls of the cavity 26.

In another embodiment, referring to FIG. 2B", the lid member 25" has a plurality of cavities 26' each receiving one electronic element 22.

Figure 2C:
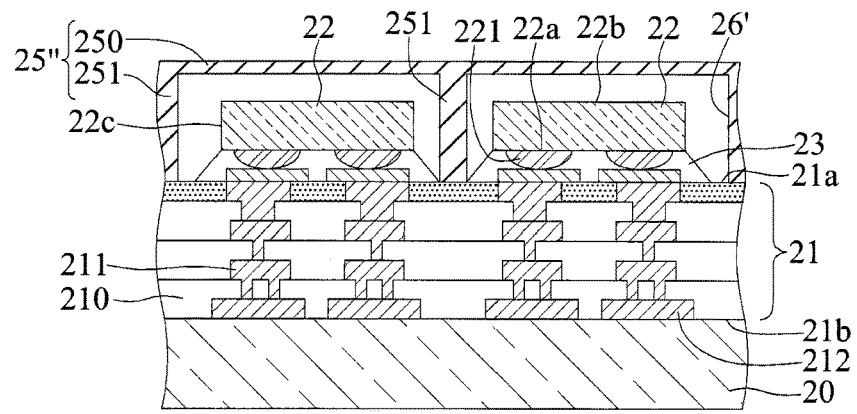
Figure 2C:
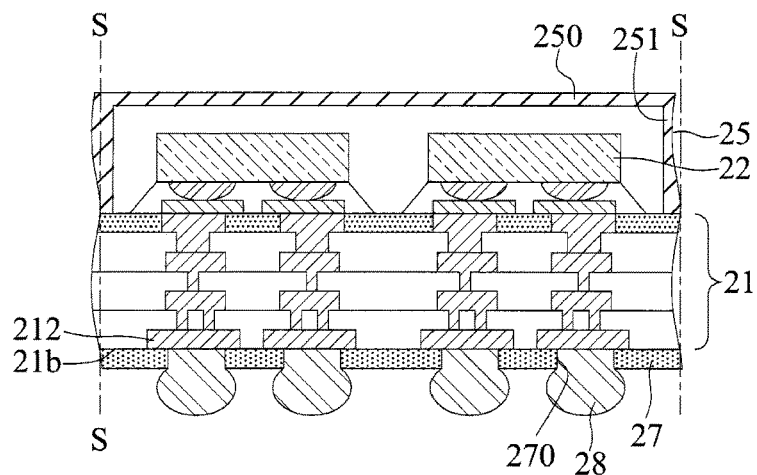

Referring to FIG. 2C, the carrier 20 is removed to expose the second side 21b of the circuit portion 21 and the conductive pads 212. Then, a plurality of conductive elements 28 such as solder balls are formed on the second side 21b of the circuit portion 21.

In the present embodiment, before formation of the conductive elements 28, an insulating layer 27 is formed on the second side 21b of the circuit portion 21. The insulating layer 27 has a plurality of openings 270 exposing the conductive pads 212, and the conductive elements 28 are formed on the conductive pads 212.

Figure 2D:
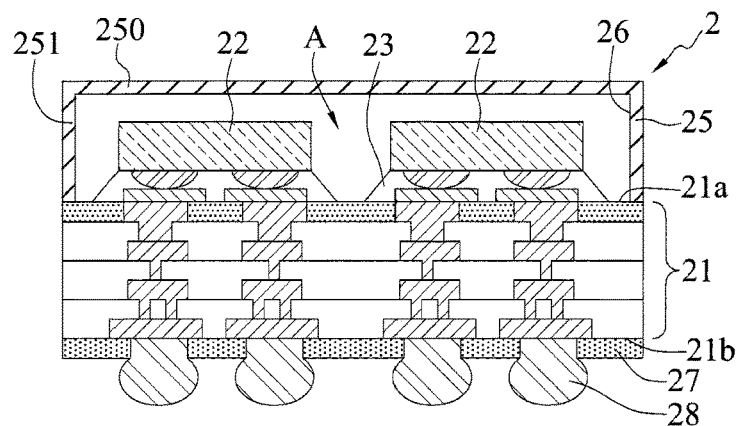
Figure 2D:
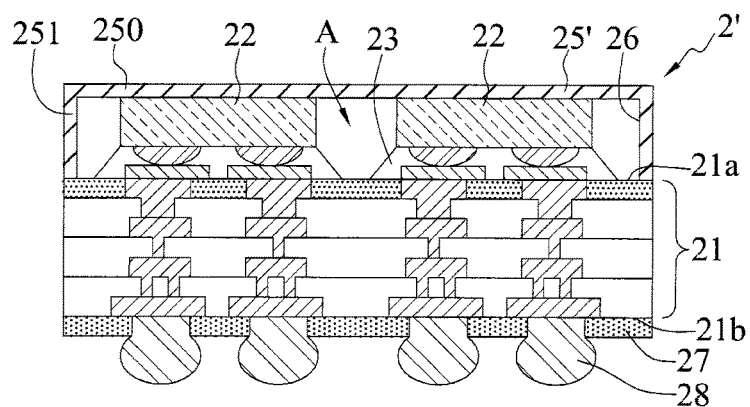

Referring to FIG. 2D, a singulation process is performed along cutting paths S of FIG. 2C (i.e., along the support portion 251 of the lid member 25) to obtain a plurality of electronic packages 2.

Alternatively, the singulation process can be performed before formation of the insulating layer 27 and the conductive elements 28.

If the process is continued form FIGS. 2B', an electronic packages 2' of FIG. 2D' is obtained. Similarly, if the process is continued form FIG. 2B", an electronic packages 2" of FIG. 2D" is obtained.

Figure 2E:
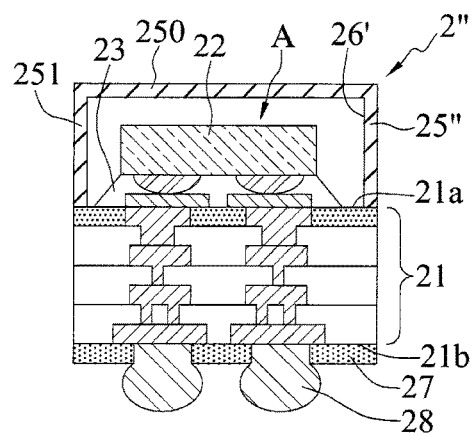
FIG. 2E is a schematic cross-sectional view of a process continued from FIG. 2D.
Figure 2E:
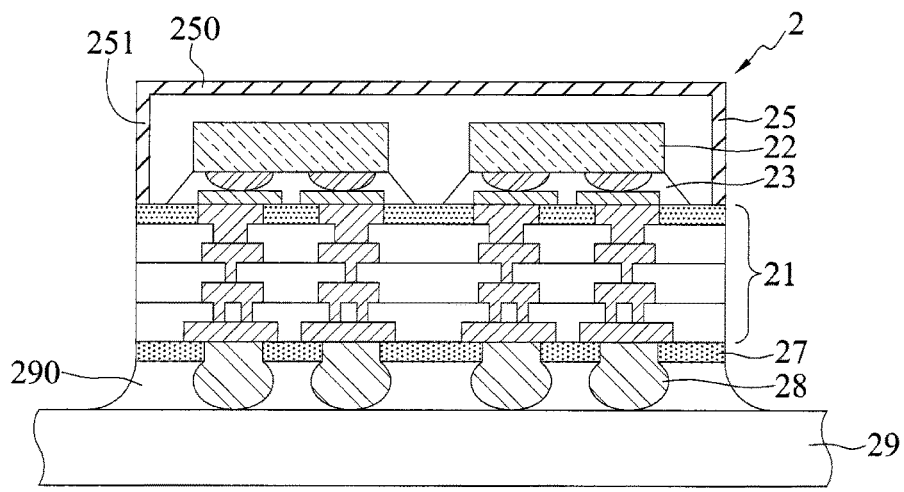

In a subsequent process, referring to FIG. 2E, the electronic package 2 is further disposed on an electronic device 29 such as a circuit board through the conductive elements 28, and an underfill 290 is formed between the electronic package 2 and the electronic device 29 to secure and protect the conductive elements 28.

Therefore, by replacing with the conventional encapsulant with the lid member 25, 25', 25", the present invention dispenses with the conventional molding and grinding processes and hence simplifies the fabrication process, saves labor and time and reduces the equipment cost, thereby greatly reducing the fabrication cost.

Further, since there is a very small CTE mismatch between the lid member 25, 25', 25" and the electronic elements 22, the present invention prevents warping of the overall structure before singulation and improves the product yield.

Furthermore, the lid member 25, 25', 25" does not absorb moisture. As such, the present invention avoids warping of the overall structure (for example, the structure of FIG. 2C) after the carrier 20 is removed.

In addition, after the carrier 20 is removed, the rigidity of the lid member 25, 25', 25" facilitates to reduce the degree of warping of the overall structure that may be caused by a large CTE mismatch between the circuit portion 21, the electronic elements 22 and the underfill 23.

The present invention prevents warping of the overall structure so as to prevent cracking of the electronic elements 22 and delamination of the conductive elements 28, thereby improving the product reliability.

The present invention further provides an electronic package 2, 2', 2", which has: a circuit portion 21 having opposite first and second sides 21a, 21b; at least an electronic element 22 disposed on the first side 21a of the circuit portion 21; and a lid member 25, 25', 25" disposed on the first side 21a of the circuit portion 21 to cover the electronic element 22, wherein a separation portion A is formed between the lid member 25, 25', 25" and the electronic element 22.

The lid member 25, 25', 25" can have at least a cavity 26, 26' for receiving the electronic element 22.

The lid member 25, 25', 25" can be made of a semiconductor material.

In an embodiment, the lid member 25' is in contact with the electronic element 22.

In an embodiment, the lid member 25, 25', 25" has a support portion 251 disposed on the first side 21a of the circuit portion 21 and a base portion 250 supported by the support portion 251 over the first side 21a of the circuit portion 21 to cover the electronic element 22.

In an embodiment, the electronic package 2, 2', 2" further has an underfill 23 formed between the first side 21a of the circuit portion 21 and the electronic element 22.

In an embodiment, the electronic package 2, 2', 2" further has a plurality of conductive elements 28 formed on the second side 21b of the circuit portion 21.

Therefore, the present invention replaces the conventional encapsulant with the lid member so as to simplify the fabrication process and save the equipment cost, thereby reducing the fabrication cost. Further, the lid member facilitates to prevent warping of the overall package structure.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A method for fabricating an electronic package, comprising the steps of:
    providing a semiconductor structure having a carrier, a circuit portion formed on the carrier and at least an electronic element disposed on the circuit portion, wherein the circuit portion has opposite first and second sides, the electronic element being disposed on the first side of the circuit portion and the second side of the circuit portion being bonded to the carrier;
    after providing the semiconductor structure, disposing a lid member on the first side of the circuit portion to cover the electronic element, wherein the lid member is free from being electrically connected with the circuit portion, and a separation portion is formed inside the lid member and between the lid member and the electronic element and is free from being filled with an encapsulant;
    removing the carrier and retaining the lid member; and
    performing a singulation process for a side surface of the lid member to be coplanar with a side surface of the circuit portion.

2. The method of claim 1, wherein the semiconductor structure further has an underfill formed between the first side of the circuit portion and the electronic element.

3. The method of claim 1, wherein the lid member has at least a cavity for receiving the electronic element.

4. The method of claim 1, wherein the lid member is in contact with the electronic element.

5. The method of claim 1, wherein the lid member is made of a semiconductor material.

6. The method of claim 1, wherein the lid member has a support portion disposed on the first side of the circuit portion and a base portion supported by the support portion over the first side of the circuit portion to cover the electronic element.

7. The method of claim 1, after removing the carrier, further comprising forming a plurality of conductive elements on the second side of the circuit portion.

* * * * *